US010779431B1

(12) United States Patent
Ho et al.

(10) Patent No.: US 10,779,431 B1
(45) Date of Patent: Sep. 15, 2020

(54) ADJUSTABLE COMPUTING CARD HOLDER IN INFORMATION HANDLING SYSTEMS

(71) Applicant: Dell Products L.P., Round Rock, TX (US)

(72) Inventors: Man Tak Ho, Austin, TX (US); Earl Reeves, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/437,719

(22) Filed: Jun. 11, 2019

(51) Int. Cl.
*H05K 5/00* (2006.01)
*H05K 7/14* (2006.01)
*H05K 5/02* (2006.01)

(52) U.S. Cl.
CPC ......... *H05K 7/1461* (2013.01); *H05K 5/0286* (2013.01)

(58) Field of Classification Search
CPC .................................. H05K 5/00; G06F 1/16
See application file for complete search history.

(56) References Cited

U.S. PATENT DOCUMENTS

2009/0067136 A1* 3/2009 Cheney .................. G06F 1/185
361/726

* cited by examiner

*Primary Examiner* — Jerry Wu
(74) *Attorney, Agent, or Firm* — Baker Botts L.L.P.

(57) ABSTRACT

An adjustable computing card holder, including a stationary body coupled to a computing chassis, the stationary body including an opening and a first surface; an adjustable body slideably positioned within the opening of the stationary body, the adjustable body having a second surface, the adjustable body configured to move with respect to the stationary body between states, including: when positioned in the first state, disengage a computing card, wherein the first state is defined when the first surface of the stationary body is spaced-apart from the second surface of the adjustable body a first distance, when positioned in the second state, engage a computing card, wherein the second state is defined when the first surface of the stationary body is spaced-apart from the second surface of the adjustable body a second distance, the second distance greater than the first distance.

16 Claims, 8 Drawing Sheets

ADJUSTABLE COMPUTING CARD HOLDER IN INFORMATION HANDLING SYSTEMS

BACKGROUND

Field of the Disclosure

The disclosure relates generally to information handling systems, and in particular, an adjustable computing card holder in information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems can include a multitude of types of computing cards and computing card slots such as peripheral component interconnect express (PCIe) cards and corresponding computing card slots. During transit/shipping of the information handling system (e.g., from a manufacturer to an end-use), the computing cards can move within the information handling system that can lead to possible damage thereof.

SUMMARY

Innovative aspects of the subject matter described in this specification may be embodied in an adjustable computing card holder, including a stationary body coupled to a computing chassis, the stationary body including an opening and a first surface; an adjustable body slideably positioned within the opening of the stationary body, the adjustable body having a second surface, the adjustable body configured to move with respect to the stationary body between a first state and a second state, including: when positioned in the first state, disengage a computing card, wherein the first state is defined when the first surface of the stationary body is spaced-apart from the second surface of the adjustable body a first distance, and when positioned in the second state, engage a computing card, wherein the second state is defined when the first surface of the stationary body is spaced-apart from the second surface of the adjustable body a second distance, wherein the second distance is greater than the first distance.

These and other embodiments may each optionally include one or more of the following features. For instance, when the adjustable body is positioned in the second state, the adjustable body engages the computing card at a first end of the computing card such that the computing card remains coupled to a computing card slot at a second end of the computing card. The stationary body further includes a plurality of slots and the adjustable body includes a plurality of teeth such that one or more of the teeth are coupled with one or more corresponding slots to define a particular distance between the first surface of the stationary body and the third surface of the adjustable body. When the adjustable body is positioned in the second state, an angle of the teeth prevent the adjustable body from moving to the first state. The adjustable body includes one or more rails that are positioned within one or more corresponding slots of the stationary body. The adjustable body is further configured to move between the first state, the second state, and a third state including: when positioned in the third state, disengage the computing card, wherein the third state is defined when the first surface of the stationary body is spaced-apart from the second surface of the adjustable body a third distance, wherein the third distance is greater than the first distance, and the second distance is greater than the third distance. The adjustable body, when positioned in the second state, engages two or more computing cards.

Innovative aspects of the subject matter described in this specification may be embodied in an information handling system, including: a computing chassis including a computing card slot; a computing card coupled to the computing card slot at a first end of the computing card; and an adjustable computing card holder, comprising: a stationary body coupled to the computing chassis, the stationary body including an opening and a first surface; an adjustable body slideably positioned within the opening of the stationary body, the adjustable body have a second surface, the adjustable body configured to move with respect to the stationary body between a first state and a second state, including: when positioned in the first state, disengage from a second end of the computing card, wherein the first state is defined when the first surface of the stationary body is spaced-apart from the second surface of the adjustable body a first distance, and when positioned in the second state, engage with the second end of the computing card, wherein the second state is defined when the first surface of the stationary body is spaced-apart from the second surface of the adjustable body a second distance, wherein the second distance is greater than the first distance.

These and other embodiments may each optionally include one or more of the following features. For instance, when the adjustable body is positioned in the second state, the adjustable body engages the computing card at the first end of the computing card such that the computing card remains coupled to the computing card slot at the second end of the computing card. The first distance is substantially zero. The stationary body further includes a plurality of slots and the adjustable body includes a plurality of teeth such that one or more of the teeth are coupled with one or more corresponding slots to define a particular distance between the first surface of the stationary body and the third surface of the adjustable body. When the adjustable body is positioned in the second state, an angle of the teeth prevent the adjustable body from moving to the first state. The adjustable body includes one or more rails that are positioned within one or more corresponding slots of the stationary body. The adjustable body is further configured to move between the first state, the second state, and a third state including when positioned in the third state, disengage the computing card, wherein the third state is defined when the first surface of the stationary body is spaced-apart from the second surface of the adjustable body a third distance, wherein the third distance is greater than the first distance, and the second distance is greater than the third distance. The adjustable body, when positioned in the second state, engages two or more computing cards.

Particular embodiments of the subject matter described in this specification may be implemented so as to realize one or more of the following advantages. For instance, the adjustable card holder can minimize and/or prevent damage to computing cards of variable sizes —e.g., damage from shocks and vibrations of the information handling system during transit of the information handling system.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This document describes an adjustable computing card holder, including a stationary body coupled to a computing chassis, the stationary body including an opening and a first surface; an adjustable body slideably positioned within the opening of the stationary body, the adjustable body have a second surface, the adjustable body configured to move with respect to the stationary body between a first state and a second state, including: when positioned in the first state, disengage a computing card, wherein the first state is defined when the first surface of the stationary body is spaced-apart from the second surface of the adjustable body a first distance, and when positioned in the second state, engage a computing card, wherein the second state is defined when the first surface of the stationary body is spaced-apart from the second surface of the adjustable body a second distance, wherein the second distance is greater than the first distance.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-8 wherein like numbers are used to indicate like and corresponding parts.

Figure 1:
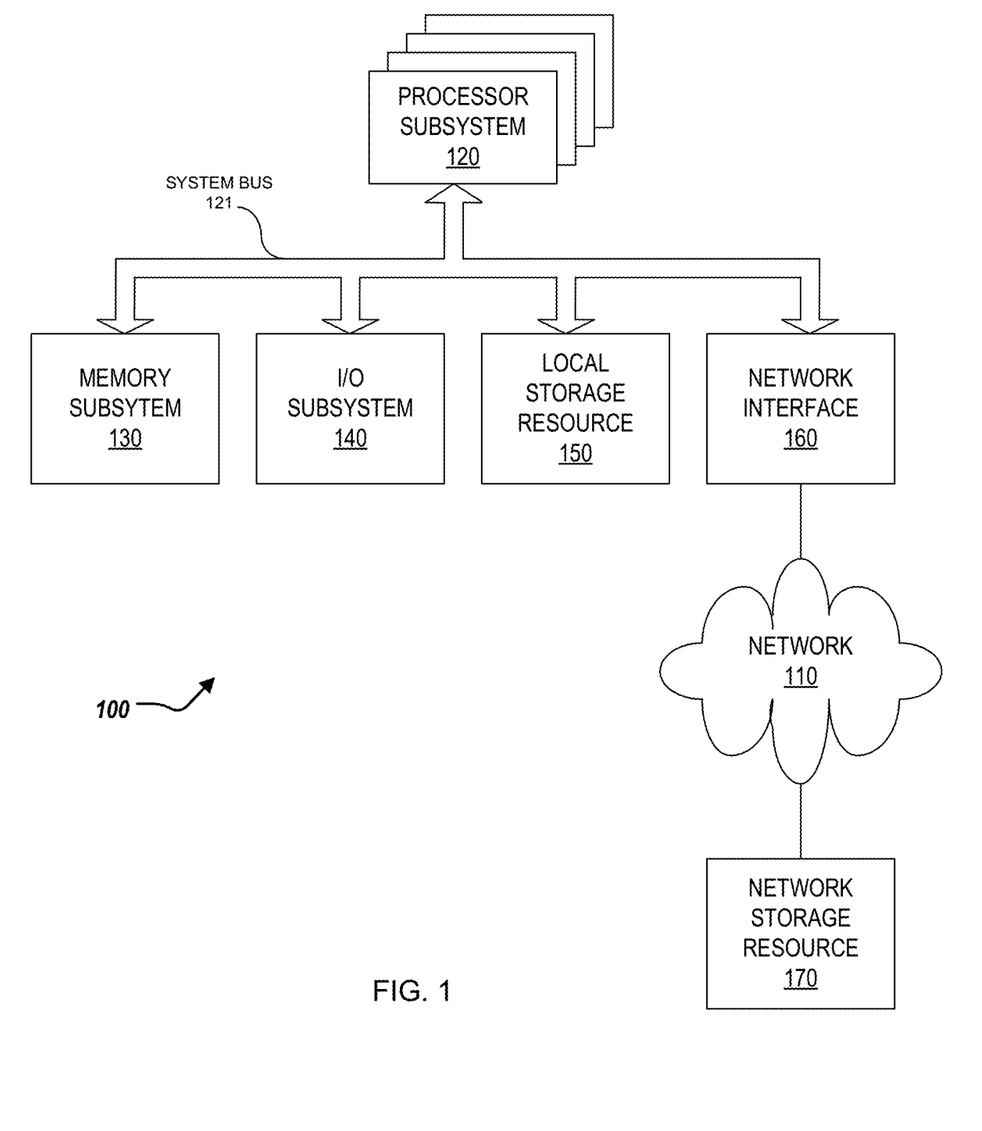
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2A:
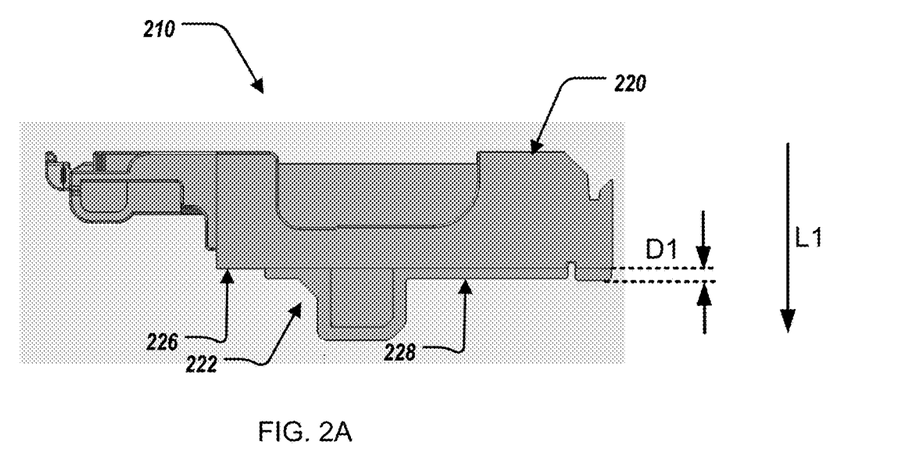
FIG. 2A illustrates a side view of an adjustable computing card holder in a first state.
Figure 2B:
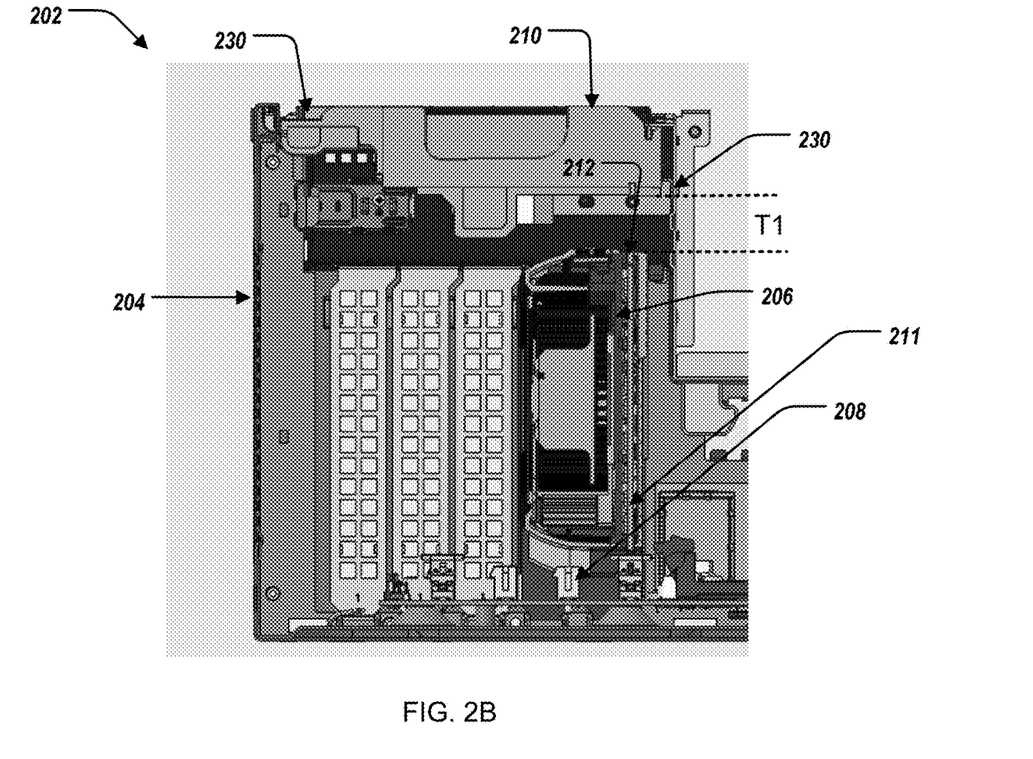
FIG. 2B illustrates a top down view of a computing chassis with the adjustable computing card holder in the first state.

Turning now to FIGS. 2A, 2B, FIGS. 2A, 2B illustrate a portion of an information handling system 202. The information handling system 202 can include a computing chassis 204, a computing card 206, a computing card slot 208, and an adjustable card holder 210. The information handling system (IHS) 202 can be similar to the information handling system 100 of FIG. 1. The computing chassis 204 can include the computing card slot 208, with the computing card 206 coupled to the computing card slot 208 at a first end 211 of the computing card 206. The computing chassis 204 can include any number of computing card slots, with one or more of the computing card slots coupled with the computing cards.

The computing card 206 can include any type of computing card that can be coupled with the computing card slot 208, including a peripheral component interconnect express (PCIe) card such as a graphics card. In some examples, the computing card 206 can vary in height with respect to the computing card slot 208—that is, the computing card 206 can vary in height from an industry standard height. In some examples, the computing card 206 can have a height between 111.15 millimeters to 131.15 millimeters.

In some examples, to minimize, if not prevent, damage to the computing card 206—e.g., during shipment/transport of the IHS 202 (from a supplier/manufacturer to an end-user)—the computing card 206 can be coupled to the chassis 204 at multiple locations. Specifically, as mentioned above, the computing card 206 is physically coupled at the first end 211 of the computing card 206 within the computing card slot 208. Additionally, the computing card 206 can be additionally coupled, or engaged with, the adjustable card holder 210 at a second end 212, opposite the first end 211, of the computing card 206. The adjustable card holder 210 can engage the computing card 206, described further herein.

Figure 3:
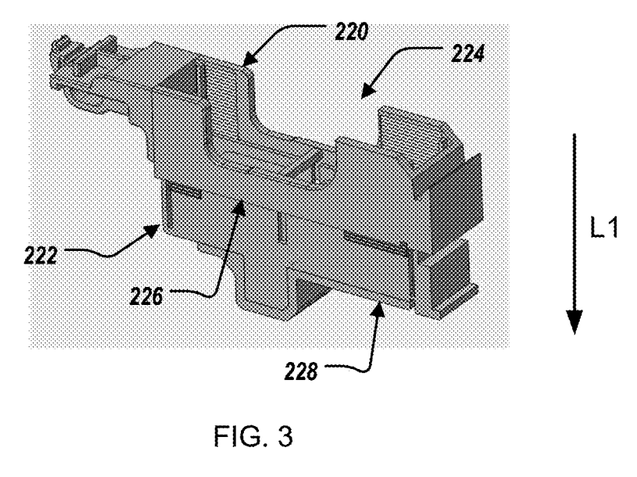
FIG. 3 illustrates a perspective view of the adjustable computing card holder.

In some implementations, referring to FIG. 3, the computing card 206 includes a stationary body 220 and an adjustable body 222. The stationary body 220 can include an opening 224 and a first surface 226. In some examples, the stationary body 220 can be fixedly attached to the chassis 204 at one or more points 230, as shown in FIG. 2B. That is, the stationary body 220 is stationary with respect to the chassis 204 and/or the adjustable body 222. The stationary body 220 can be fixedly attached to the chassis 204 with one or more coupling elements such as screws, fasteners, etc.

The adjustable body 222 can be coupled to the stationary body 220 such that the adjustable body 222 is slideably positioned within the opening 224 of the stationary body 220. That is, the adjustable body 222 is able to move within the opening 224 of the stationary body 220. Specifically, the adjustable body 222 is able to move in a direction L1 with respect to the stationary body 220, e.g., in response to a force exerted on the adjustable body 222, described further herein. The adjustable body 222 can include a second surface 228. To that end, the adjustable body 222 can be configured to move with respect to the stationary body 220 between multiple states (e.g., positions).

Referring back to FIGS. 2A, 2B, in some examples, the adjustable body 222 is configured to be in a first state. That is, the adjustable body 222 is configured to be in a first position with respect to the stationary body 220. In some examples, the first state of the adjustable body 222 with respect to the stationary body 220 can include the first surface 226 of the stationary body 220 is spaced-apart from the second surface 228 of the adjustable body 222 by a first distance D1. In some examples, the second surface 228 of the adjustable body 222, when the adjustable body 222 is in the first state, is spaced-apart from the second end 212 of the computing card 206 by a particular distance T1. Further, when the adjustable body 222 is in the first state and spaced-apart from the computing card 206 by the particular distance T1, the adjustable body 222 is disengaged with the computing card 206. That is, the adjustable body 222, and further the adjustable card holder 210, is not in contact with the computing card 206, and/or adjacent to the computing card 206, such that the adjustable card holder 210 is disengaged from the computing card 206. When the adjustable card holder 210 is disengaged from the computing card 206, the adjustable card holder 210 does not "hold" the computing card 206, or provide additional support to the computing card 206. In some examples, the first distance D1 is substantially zero. In some examples, the first distance D1 is approximately 1 millimeter. In some examples, the first distance D1 is less than 5 millimeters.

Figure 4A:
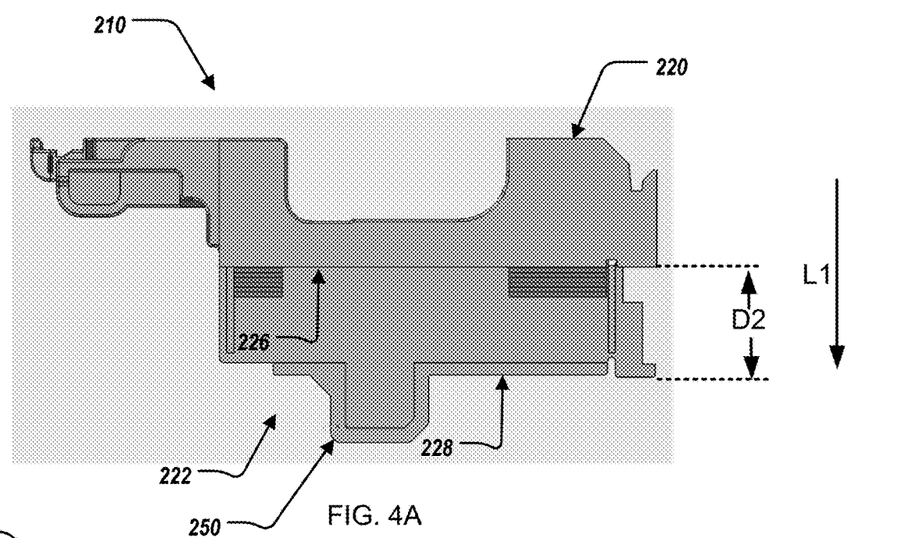
FIG. 4A illustrates a side view of the adjustable computing card holder in a second state.
Figure 4B:
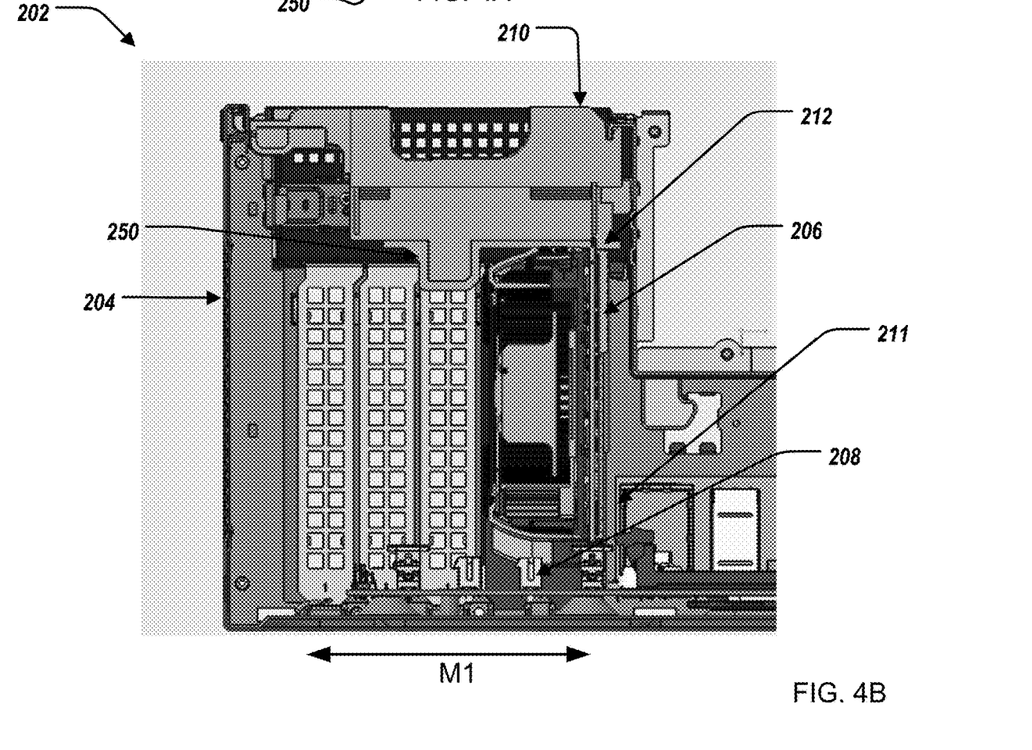
FIG. 4B illustrates a top down view of the computing chassis with the adjustable computing card holder in the second state.

Referring to FIGS. 4A, 4B, in some examples, the adjustable body 222 is configured to be in a second state. That is, the adjustable body 222 is configured to be in a second position with respect to the stationary body 220. In some examples, the second state of the adjustable body 222 with respect to the stationary body 220 can include the first surface 226 of the stationary body 220 is spaced-apart from the second surface 228 of the adjustable body 222 by a second distance D2 that is greater than the first distance D1. In some examples, the second surface 228 of the adjustable body 222, when in the adjustable body 222 is in the second state, is in contact with the second end 212 of the computing card 206. That is, when the adjustable body 222 is in the second state and in contact with the computing card 206, the adjustable body 222 is engaged with the computing card 206. That is, the adjustable body 222, and further the adjustable card holder 210, is in contact with the computing card 206, and/or adjacent to the computing card 206, such that the adjustable card holder 210 is engaged with the computing card 206. Specifically, the adjustable body 222, when in the second state, engages the computing card 206 at the second end 212 of the computing card 206 such that the computing card 206 remains coupled to the computing card slot 208 at the first end 211 of the computing card 206. When the adjustable card holder 210 is engaged with the computing card 206, the adjustable card holder 210 "holds" the computing card 206, and provides additional support to the computing card 206. That is, the adjustable card holder 210, when in the second state and engaged with the computing card 206, prevents or minimizes, damage to the computing card 206—e.g., damage from shocks and vibrations of the information handling system 202 during transit of the information handling system 202.

In some examples, the adjustable body 222 is further configured to be in a third state. That is, the adjustable body 222 is configured to be in a third position with respect to the stationary body 220. In some examples, the third state of the adjustable body 222 with respect to the stationary body 220 can include the first surface 226 of the stationary body 220 is spaced-apart from the second surface 228 of the adjustable body 222 by a third distance D3 (not shown) greater than the first distance D1. In some examples, the second surface 228 of the adjustable body 222, when the adjustable body 222 is in the third state, is spaced-apart from the second end 212 of the computing card 206 by a particular distance T2 (not shown), less than the particular distance T1. Further, when the adjustable body 222 is in the third state and spaced-apart from the computing card 206 by the particular distance T2, the adjustable body 222 is disengaged with the computing card 206. Similar to that described with respect to the first state of the adjustable body 222, when the adjustable body 222 is in the third state, the adjustable card holder 210 is not in contact with the computing card 206, and/or adjacent to the computing card 206, such that the adjustable card holder 210 is disengaged from the computing card 206.

In some examples, when the adjustable body 222 is in the first state, the second surface 228 of the adjustable body 222 is in contact with the second end 212 of the computing card 206. That is, when the adjustable body 222 is in contact with the computing card 206, the adjustable body 222 is engaged with the computing card 206, while the first surface 226 of the stationary body 220 is spaced-apart from the second surface 228 of the adjustable body 222 by the first distance D1.

In some examples, the adjustable body 222 can be in any state/position with respect to the stationary body 220 and/or the computing card 206 between the first and the second states.

In some examples, the adjustable card holder 210 can engage two or more computing cards 206 at a time.

Figure 5:
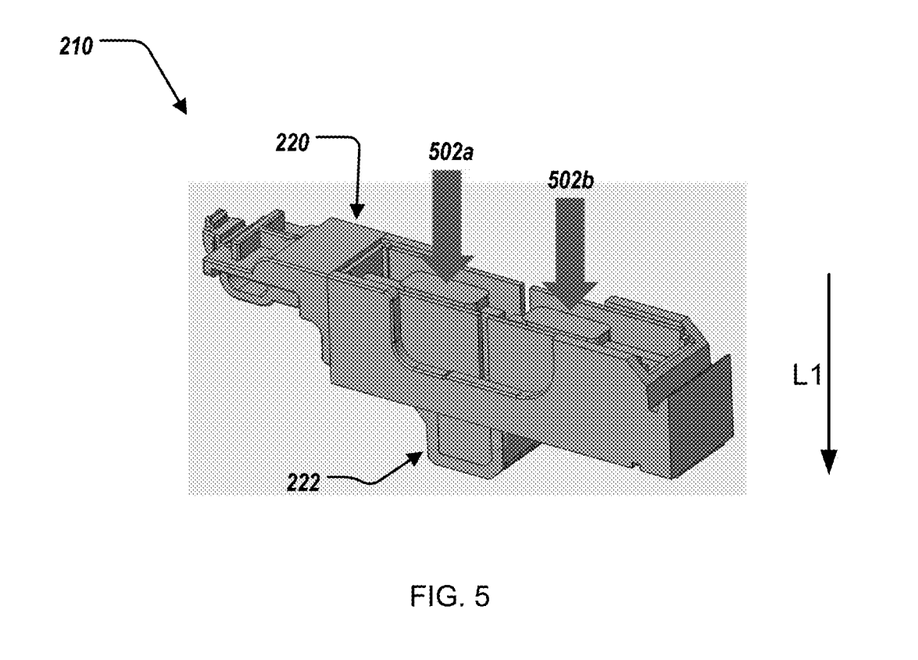
FIG. 5 illustrates a perspective view of the adjustable computing card holder.

Referring to FIG. 5, FIG. 5 illustrates a perspective view of the adjustable card holder 210. Specifically, when changing the state of the adjustable body 222 (e.g., from the first state to the second state), a force can be applied to the adjustable body 222 as shown by force arrows 502a, 502b (collectively referred to as force arrows 502) along the direction L1 (e.g., the "C direction").

Figure 6A:
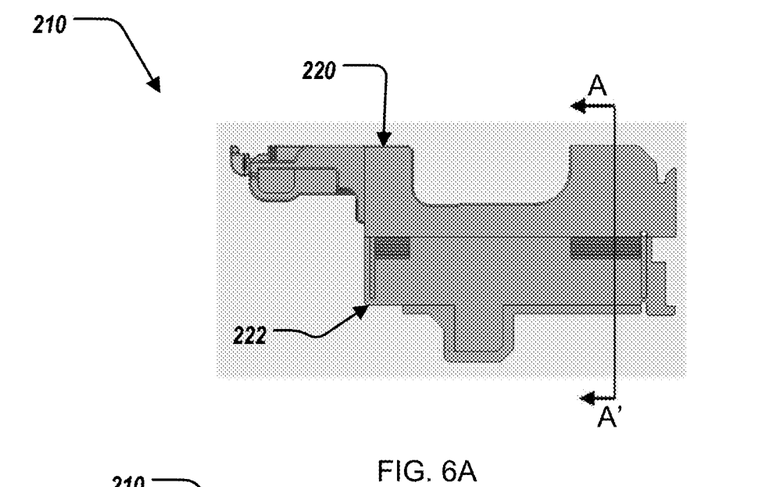
FIG. 6A illustrates a side view of the adjustable computing card holder in the second state.
Figure 6B:
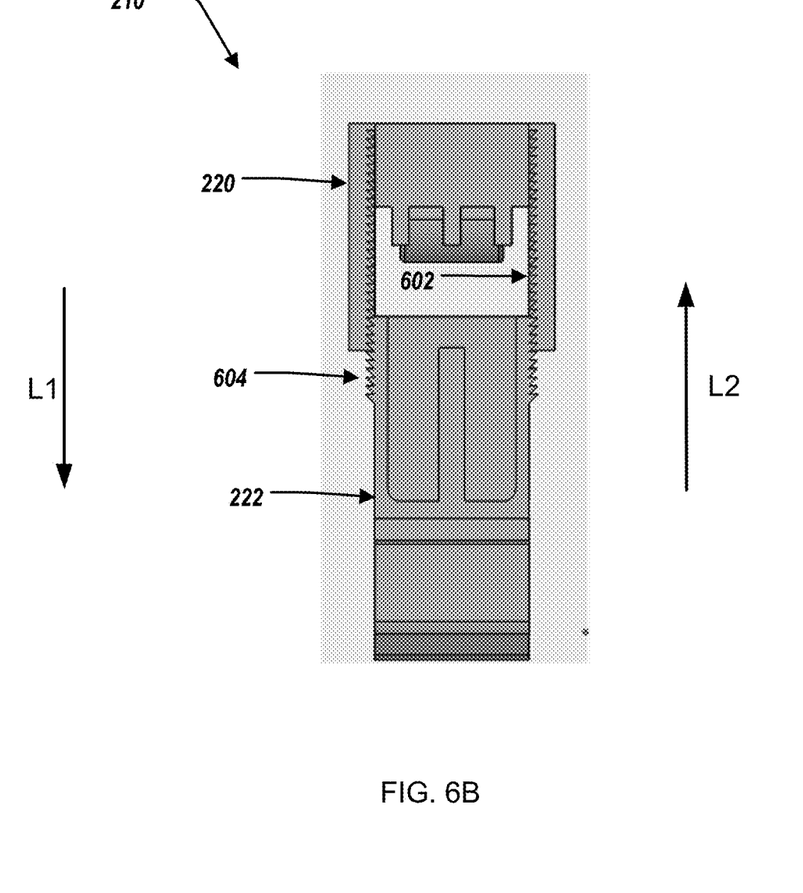
FIG. 6B illustrates a front view of the adjustable computing card holder in the second state showing direction of travel.

Referring to FIGS. 6A, 6B, FIGS. 6A, 6B illustrate the adjustable card holder 210 including a teeth and slot configuration. Specifically, FIG. 6A illustrates a side view of the adjustable card holder 210, and FIG. 6B illustrates a front view of the adjustable card holder 210 as viewed from the line A-A' of FIG. 6A. The stationary body 220 can include a plurality of slots 602 and the adjustable body 222 can include a plurality of teeth 604. The number of slots 602 and the number of teeth 604 can vary based on the application desired. To that end, the teeth 604 can be configured such that teeth 604 can be coupled with corresponding slots 602 that defines the distance between the first surface 226 of the stationary body 220 and the second surface 228 of the adjustable body 222. That is, the particular slots 602 that the teeth 604 engage with can define the distance between the first surface 226 of the stationary body 220 and the second surface 228 of the adjustable body 222.

In some examples, the teeth 604 of the adjustable body 222 can be angled with respect to the direction of travel of the adjustable body 222 along the direction L1. Similarly, the slots 602 of the stationary body 222 can be correspondingly angled to the angle of the teeth 604. Specifically, the angle of the teeth 604 can minimize, if not prevent, movement of the adjustable body 222 along a direction L2 with respect to the stationary body 220 (and from the second state to the first state), while allowing movement of the adjustable body 222 along the direction L1 with respect to the stationary body 220 (from the first state to the second state). In some examples, the pitch between the teeth 604 can be approximately 1 millimeter; however, the teeth 604 can include any pitch as desired based on the application.

Figure 7:
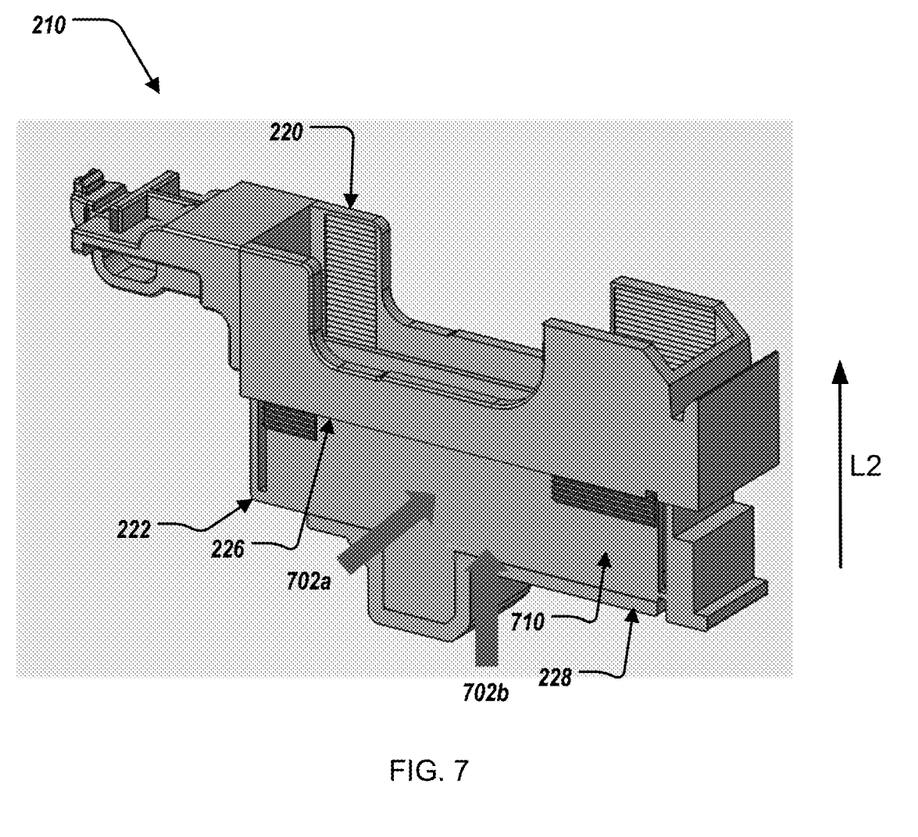
FIG. 7 illustrates a perspective view of the adjustable computing card holder showing force directions for changing states.

Referring to FIG. 7, FIG. 7 illustrates a perspective view of the adjustable card holder 210. Specifically, in some examples, to change the state of the adjustable body 222 from the second state to the first state—e.g., to decrease the distance between the first surface 226 of the stationary body 220 and the second surface 228 of the adjustable body 222—forces 702a, 702b (collectively referred to as force arrows 702), can be applied simultaneously to the adjustable body 222. That is, a force 702a can be applied to the side 710 of the adjustable body 222 (and a correspondingly force can be applied to the opposite side) such that the teeth 604 become disengaged from the slots 602. In some examples, the adjustable body 222 can be flexible (e.g., includes a plastic material) such that the adjustable body 222 can be flexed when the force 702a is applied thereto. Furthermore, while simultaneously applying the force 702a, the force 702b can be applied to the first surface 228 of the adjustable body 222 to translate the adjustable body along the direction L2.

Figure 8:
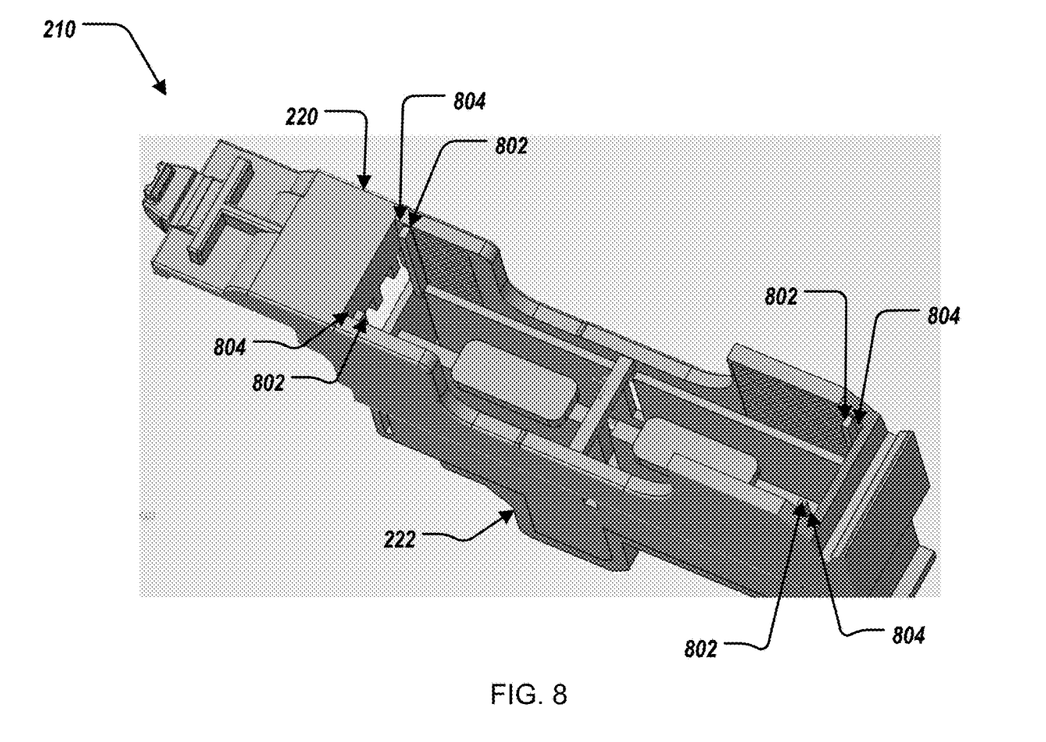
FIG. 8 illustrates a top down view of the adjustable computing card holder showing rails.

Referring to FIG. 8, FIG. 8 illustrates a top down view of the adjustable card holder 210. Specifically, the adjustable body 222 can include rails 802 and the stationary body 220 can include slots 804. To that end, the rails 802 of the adjustable body 222 can be positioned within the slots 804 of the stationary body 222. As a result, during movement of the adjustable body 222 with respect to the stationary body 220 (e.g., when moving from the first state to the second state), the rails 802 and the slots 804 minimize, if not prevent, rotation of the adjustable body 222 with respect to the stationary body 220 and/or uneven translation of the adjustable body 222 along the direction L1.

Referring back to FIGS. 4A, 4B, in some examples, the adjustable card holder 210 can include a notch 250. The notch 250 can further "hold" the computing card 206 such that movement of the computing card 206, when the adjustable body 222 is in the second state and engaged with the computing card 206, to minimize, if not prevent, movement of the computing card 206 in the direction M1.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An adjustable computing card holder, comprising:
 a stationary body coupled to a computing chassis, the stationary body including an opening and a first surface on a bottom side opposite to the opening;
 an adjustable body slideably positioned within the opening of the stationary body, the adjustable body having a first side, a second side, and a second surface parallel to the first surface and extending between the first and the second sides, the adjustable body configured to move with respect to the stationary body between a first state and a second state, including:

when positioned in the first state, disengage a computing card, wherein the first state is defined when the first surface of the stationary body is spaced-apart from the second surface of the adjustable body a first distance, and when positioned in the second state, engage a computing card, wherein the second state is defined when the first surface of the stationary body is spaced-apart from the second surface of the adjustable body a second distance, wherein the second distance is greater than the first distance; and a notch coupled to the adjustable body and protruding from the second surface towards the computing card, the notch having a third surface perpendicular to the second surface of the adjustable body, wherein when the adjustable body is in the second state, the third surface of the notch engages the computing card; and the stationary body further including a plurality of slots and the adjustable body includes a plurality of teeth along the first and second sides such that one or more of the teeth are coupled with one or more corresponding slots to define a particular distance between the first surface of the stationary body and the second surface of the adjustable body.

2. The adjustable computing card holder of claim 1, wherein, when the adjustable body is positioned in the second state, the third surface of the notch of the adjustable body engages the computing card at a first end of the computing card such that the computing card remains coupled to a computing card slot at a second end of the computing card.

3. The adjustable computing card holder of claim 1, wherein the first distance is substantially zero.

4. The adjustable computing card holder of claim 1, wherein, when the adjustable body is positioned in the second state, an angle of the teeth prevent the adjustable body from moving to the first state.

5. The adjustable computing card holder of claim 1, wherein the adjustable body includes one or more rails that are positioned within one or more corresponding slots of the stationary body.

6. The adjustable computing card holder of claim 1, wherein the adjustable body is further configured to move between the first state, the second state, and a third state including:

when positioned in the third state, disengage the computing card, wherein the third state is defined when the first surface of the stationary body is spaced-apart from the second surface of the adjustable body a third distance, wherein the third distance is greater than the first distance, and the second distance is greater than the third distance.

7. The adjustable computing card holder of claim 1, wherein the adjustable body, when positioned in the second state, engages two or more computing cards.

8. An information handling system, including:
a computing chassis including a computing card slot;
a computing card coupled to the computing card slot at a first end of the computing card; and
an adjustable computing card holder, comprising:
a stationary body coupled to the computing chassis, the stationary body including an opening and a first surface on a bottom side opposite to the opening;
an adjustable body slideably positioned within the opening of the stationary body, the adjustable body having a first side, a second side, and a second surface parallel to the first surface and extending between the first and the second sides, the adjustable body configured to move with respect to the stationary body between a first state and a second state, including:

when positioned in the first state, disengage from a second end of the computing card, wherein the first state is defined when the first surface of the stationary body is spaced-apart from the second surface of the adjustable body a first distance, and when positioned in the second state, engage with the second end of the computing card, wherein the second state is defined when the first surface of the stationary body is spaced-apart from the second surface of the adjustable body a second distance, wherein the second distance is greater than the first distance; and a notch coupled to the adjustable body and protruding from the second surface towards the computing card, the notch having a third surface perpendicular to the second surface of the adjustable body, wherein when the adjustable body is in the second state, the third surface of the notch engages the computing card; and the stationary body further including a plurality of slots and the adjustable body includes a plurality of teeth along the first and second sides such that one or more of the teeth are coupled with one or more corresponding slots to define a particular distance between the first surface of the stationary body and the second surface of the adjustable body.

9. The information handling system of claim 8, wherein, when the adjustable body is positioned in the second state, the third surface of the notch of the adjustable body engages the computing card at the first end of the computing card such that the computing card remains coupled to the computing card slot at the second end of the computing card.

10. The information handling system of claim 8, wherein the first distance is substantially zero.

11. The information handling system of claim 8, wherein, when the adjustable body is positioned in the second state, an angle of the teeth prevent the adjustable body from moving to the first state.

12. The information handling system of claim 8, wherein the adjustable body includes one or more rails that are positioned within one or more corresponding slots of the stationary body.

13. The information handling system of claim 8, wherein the adjustable body is further configured to move between the first state, the second state, and a third state including:

when positioned in the third state, disengage the computing card, wherein the third state is defined when the first surface of the stationary body is spaced-apart from the second surface of the adjustable body a third distance, wherein the third distance is greater than the first distance, and the second distance is greater than the third distance.

14. The information handling system of claim 8, wherein the adjustable body, when positioned in the second state, engages two or more computing cards.

15. The information handling system of claim 8, wherein the adjustable body of the adjustable computing card holder is configured to move with respect to the stationary body from the first state to the second state.

16. The information handling system of claim 8, wherein the adjustable body of the adjustable computing card holder is configured to move with respect to the stationary body from the second state to the first state.

\* \* \* \* \*